United States Patent [19]

Sooch

[11] Patent Number: 5,258,758
[45] Date of Patent: Nov. 2, 1993

[54] DAC SHUTDOWN FOR LOW POWER SUPPLY CONDITION

[75] Inventor: Navdeep S. Sooch, Austin, Tex.

[73] Assignee: Crystal Semiconductor Corporation, Austin, Tex.

[21] Appl. No.: 648,791

[22] Filed: Jan. 31, 1991

[51] Int. Cl.⁵ ............................................. H03M 1/66
[52] U.S. Cl. ...................................... 341/144; 361/92; 307/130; 371/66
[58] Field of Search .................. 341/143, 144; 361/54, 361/55, 56, 92; 307/130, 273.3; 371/14, 66

[56] References Cited

U.S. PATENT DOCUMENTS

| | | | |
|---|---|---|---|
| 4,270,168 | 5/1981 | Murphy et al. | 364/200 |
| 4,276,593 | 6/1981 | Hansen | 364/119 |
| 4,428,020 | 1/1984 | Blanchard, Jr. | 361/92 X |
| 4,530,027 | 7/1985 | Berger | 361/92 |
| 4,665,459 | 5/1987 | Bynum et al. | 361/91 |

*Primary Examiner*—Howard L. Williams
*Attorney, Agent, or Firm*—Gregory M. Howison

[57] ABSTRACT

A digital-to-analog converter for operating in a low power condition includes a delta-sigma modulator (10) for converting an n-bit digital input signal to an m-bit digital output signal. The output signal is filtered with a switched-capacitor filter (12) and an active RC low-pass filter (18). A low power supply detect circuit receives two power supply input voltages, the low and the high power supplies, and outputs a control signal on a line (38) indicating a low power supply condition. The digital-to-analog converter includes an output stage (26) with the analog output thereof being connected to an analog output terminal (30). A switch (28) is provided for connecting the output stage to the analog output terminal (30) in normal operating mode. In a low power mode, the low power detect circuit (20) generates a control signal on line (38) in response to the power supply voltage falling below a predetermined threshold. The switch (28) is opened and a shunt switch (32) provides a squelch operation by being configured in a closed configuration during a low power condition. Alternately, the output stage (26) can be powered down in the low power condition.

20 Claims, 2 Drawing Sheets

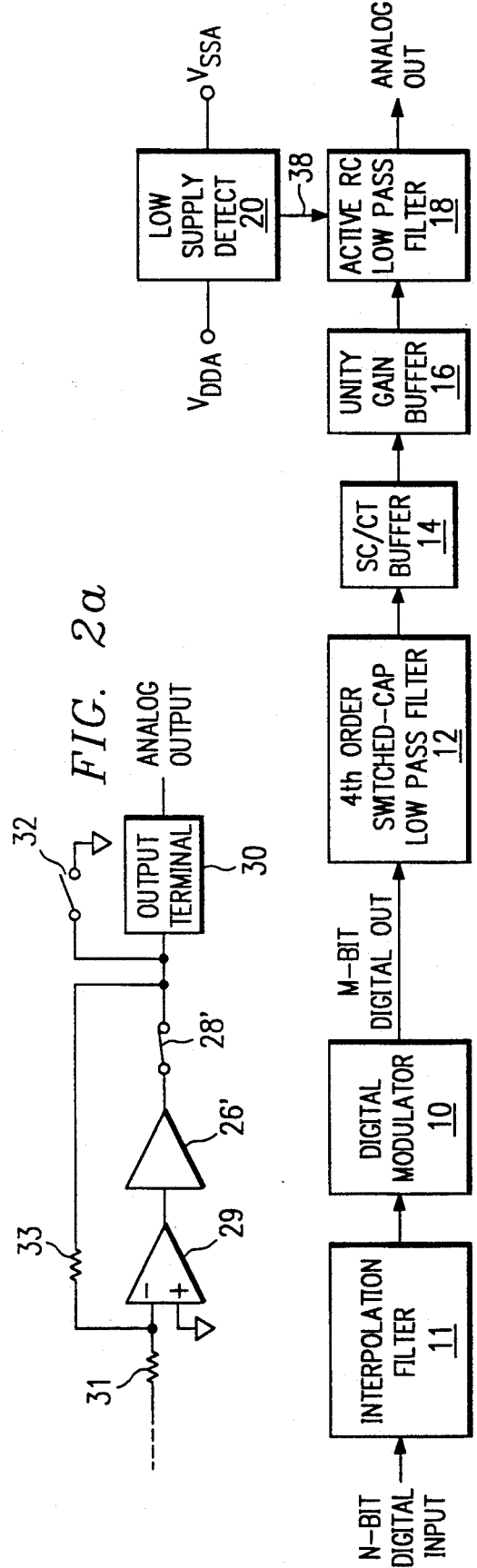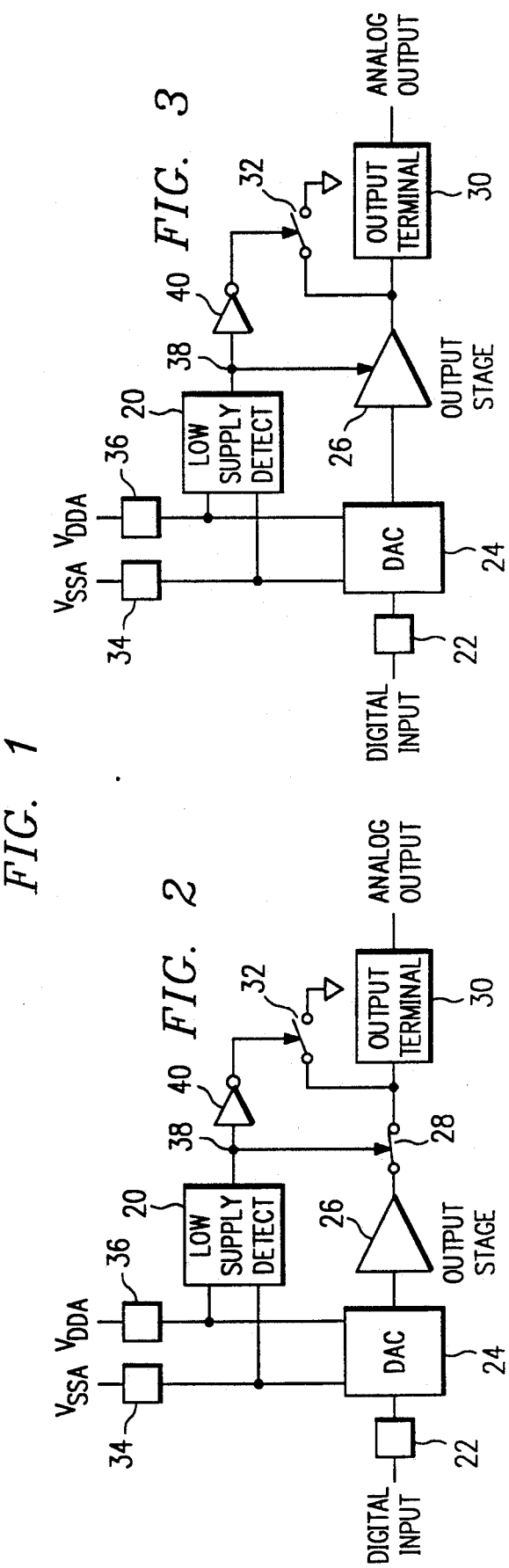

DAC SHUTDOWN FOR LOW POWER SUPPLY CONDITION

TECHNICAL FIELD OF THE INVENTION

The present invention pertains in general to digital-to-analog converters, and more particularly, to a digital-to-analog converter for sensing a low known power condition and powering down the output thereof.

BACKGROUND OF THE INVENTION

Digital-to-analog converter (DAC) applications generally require that the DAC output be held at a known voltage, preferably zero volts, during power up and power down operations. This is especially the case in audio applications wherein undesirable outputs from a DAC during power up and power down can cause audible "clicks" and "pops". Further, in industrial environments, valves can open and close randomly during power transients resulting in a poor operating environment. In view of the disadvantages, there exists a need for an integrated circuit DAC that can operate in a low power environment and tolerate power up and power down conditions to ensure proper operation of the DAC in these power up or power down operations.

SUMMARY OF THE INVENTION

The present invention disclosed and claimed herein comprises an integrated digital-to-analog converter for operating in a low power condition. A power supply terminal is provided for receiving a power supply voltage. A digital input terminal is provided for receiving a digital signal, and an analog terminal is provided for outputting an analog output signal. A DAC circuit operating from the received power supply signal converts the digital input signal to an analog output signal. The analog output signal is interfaced with the analog output terminal through interface circuitry. A low power detect circuit is provided for detecting when the received power supply falls below a predetermined threshold. The power supply detect circuit is operable to generate a control signal in response to the low power condition being present. Control circuitry isolates the internal analog output from the output terminal in response to generation of the control signal.

In another aspect of the present invention, the control circuitry is operable to disconnect the output of the DAC from the analog output terminal. A shunt switch is then provided for connecting the output terminal to an internal signal level, the internal signal level being ground.

In a further embodiment of the present invention, the DAC circuit includes an output stage. The output stage is forced to a high output impedance condition followed by connection of the analog output signal to ground.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a block diagram of the DAC with the low-supply detect circuit associated with the output low-pass filter stage;

FIG. 2 illustrates a block diagram of one embodiment of the present invention wherein the low-power supply detect circuit controls output switches that are connected to the output stage;

FIG. 3 illustrates an alternate embodiment of the present invention wherein the low-power supply detect circuit controls the output stage to power down the output stage to effect the power down operation;

DETAILED DESCRIPTION OF THE INVENTION

Figure 4:
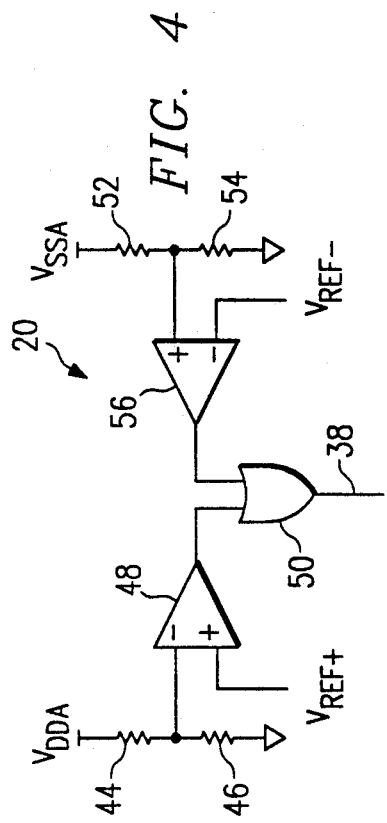
FIG. 4 illustrates a logic diagram of the low-power supply detect circuit.

Referring now to FIG. 1, there is illustrated an overall block diagram of a digital-to-analog converter (DAC) utilizing a low noise/low distortion switched-capacitor/continuous time filter. An n-bit digital input is received on the input of an interpolation filter 11, the output of which is input to a digital modulator 10 that is operable to convert the n-bit input to an m-bit digital output, m being less than n. In the preferred embodiment, the digital modulator 10 is comprised of an oversampling and noise shaping circuit utilizing a delta-sigma digital modulator that effectively converts the n-bit digital word to an m-bit digital output. In the preferred embodiment, m is equal to a value of "one". This is described in U.S. patent application Ser. No. 571,376, filed Aug. 22, 1990, and entitled "Phase Equalization System for a Digital-To-Analog Converter", issued as U.S. Pat. No. 5,061,925 which is incorporated herein by reference. However, it should be understood that a multi-bit output digital modulator could be utilized.

Although a delta-sigma modulator is utilized in the preferred embodiment, it should be understood that any type of D/A convertor can be utilized to provide the conversion from an n-bit digital word to an analog output voltage. The delta-sigma modulator is utilized as it provides excellent low level performance and excellent low differential non-linearity. The general operation of the digital modulator 10 is known in the art and described in Yasuykui Matsuia, Kuniharu Uchimura, Atsushi Awaiti and Takayo Kaneko, "A 17-Bit Oversampling D-To-A Conversion Technology Using Multi-Stage Noise Shaping", IEEE J. of Solid-State Circuits, Vol. 24, No. 4, August, 1989, which is incorporated herein by reference and V. Friedman, et. al. "A Dual-Channel Voice-Band PCM Codec Using $\Sigma\Delta$ Modulation Technique", IEEE Journal of Solid State Circuits, Vol. 24, No. 2, April 1989, which is incorporated herein by reference. However, it should be understood that a multi-bit output digital modulator could be utilized.

The one-bit digital stream output by the digital modulator 10 is input to a fourth order switched-capacitor low-pass filter 12. The filter 12 is a Butterworth filter which has integral with the input thereof a one-bit DAC. The output of the filter 12 is input to a switched-capacitor/continuous time buffer 14 that converts the switched-capacitor output of the filter 12 into a continuous time format with relatively low distortion. This is then input to a high impedance, low distortion unity gain buffer 16, the output of which is input to an active RC low-pass filter 18. The output of the active RC low-pass filter 18 provides the low impedance analog output of the overall digital-to-analog converter of FIG. 1.

A low power supply detect circuit 20 is provided that has input thereto the supply voltage $V_{DDA}$ and $V_{SSA}$, the high supply voltage and the low supply voltage, respectively. The output of the low-power supply detect voltage is connected to the output stages of the DACs in the low-pass filter 18. However, it should be understood that any internal node of the DAC could be utilized as a control node in order to control the output signal on the analog output 10. The low-power supply detect circuit 20 is operable to sense when either of the voltages $V_{DDA}$ or $V_{SSA}$ is below a predetermined threshold. In a typical 5 volt system wherein the voltage $V_{DDA}$ is a positive supply voltage and the voltage $V_{SSA}$ is a negative 5 volts, the threshold is set to approximately 3 volts. However, it could be set to any threshold that is desirable. When the supply voltages fall below their respective thresholds, a control signal is generated on the output of the low-power supply circuit 20. When the signal is generated, the output is forced to a zero voltage level, or any predefined voltage level. This will be described in more detail hereinbelow.

Referring now to FIG. 2, there is illustrated a block diagram of one embodiment of the output control circuit. The digital input is received on an input terminal 22 for input to a block 24 which represents the DAC operation. The output of the DAC 24 is input to an output stage 26, the output of which is connected to one side of a series switch 28. The other side of the series switch 28 is connected to an output terminal 30 which provides the analog output voltage. In addition, a shunt switch 32 is provided which is connected between the output terminal 30 and ground. Switches 28 and 32 operate in combination such that switch 32 is open when switch 28 is closed, and switch 32 can be closed when switch 28 is open.

The negative supply voltage is received on a supply terminal 34 and the positive supply voltage is received on a positive supply terminal 36. The terminals 34 and 36 are connected to the DAC to provide power therefor. In addition, the terminals 34 and 36 are connected to the low-power supply detect circuit 20 which provides an output on a control line 38. The output on line 38 is directly connected to the control input for switch 28, and also to the control input for switch 32 through an invertor circuit 40.

In operation, the control circuit of FIG. 2 is operable to maintain switch 28 in a closed position during normal operation such that the output stage 26 is connected to the output terminal 30. However, when a low power supply condition is detected, the switch 28 is open and the switch 32 is closed. This is referred to as a "squelch" operation.

In the embodiment of FIG. 2, the non-linearity of switch 28 contributes to the non-linearity of the DAC. FIG. 2a illustrates a detail of the implementation of the output stage 26 and the switch 28 that significantly reduces the non-linearity due to switch 28. The output stage 26 is configured of two stages, an output stage 26' and a preceding stage 29. A switch 28' represents the switch 28. The preceding amplifier 29 has the positive input thereof connected to ground and the negative input thereof connected through a resistor 31 to the next preceding stage. A feedback resistor 33 is provided with one side thereof connected to the negative input of the preceding stage 29 and the other end thereof connected to the output terminal on the side of the switch 28' diametrically opposite to the output of the output stage 26'. Since switch 28' is connected inside the feedback loop, its non-linearity is reduced by the open loop gain of the loop.

Referring now to FIG. 3, there is illustrated an alternate embodiment of the present invention. In the embodiment of FIG. 3, the output of the low power supply detect circuit 20 on line 38 is input directly to the output stage 26 to control the output stage 26 to operate in a high output impedance state in the presence of a low power supply condition. As was the case with the embodiment of FIG. 2, the switch 32 is operable to force the output terminal 30 to a predetermined voltage level.

Referring now to FIG. 4, there is illustrated a logic diagram of the low-power supply detect circuit 20. The voltage $V_{DDA}$ is input to a voltage divider made up of resistors 44 and 46. The tap terminal at the midpoint between resistors 44 and 46 is connected to the negative input of a comparator 48, the positive input of which is connected to a positive reference voltage $V_{REF+}$. The output of comparator 48 is input to one input of a two input OR gate 50. In a similar manner, the voltage $V_{SSA}$ is input to a voltage divider made up of two resistors 52 and 54, the midpoint thereof providing a tap for connection to the positive input of a comparator 56, the negative input of which is connected to a negative reference voltage $V_{REF-}$. The output of comparator 56 is input the other input of the OR gate 50. The OR gate 50 provides the output on line 38.

Figure 5:
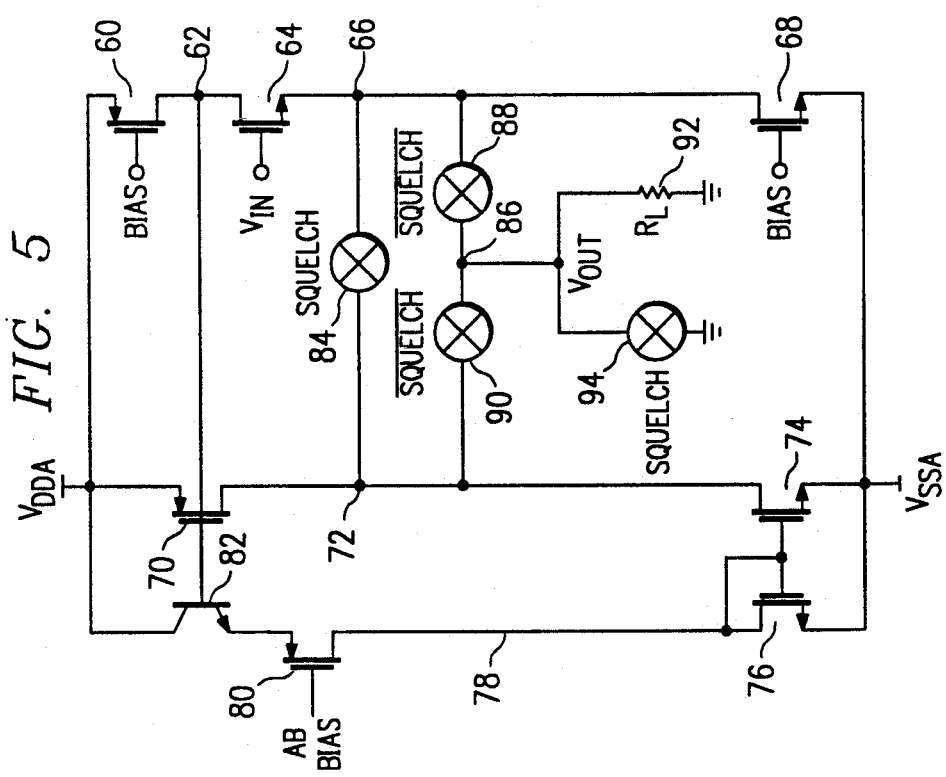
FIG. 5 illustrates a schematic diagram of the output stage.

Referring now to FIG. 5, there is illustrated a schematic diagram of the output stage of the amplifier corresponding to the embodiment of FIG. 2a, wherein the output stage is isolated from the output terminal 30 during a low power condition. A P-channel transistor 60 provides a constant current source to a node 62, the gate of P-channel transistor 60 being connected to a bias voltage and the source/drain thereof connected between the node 62 and $V_{DDA}$. The source follower transistor 64 is provided having the source/drain path thereof connected between the node 62 and an output node 66 and the gate thereof connected to the input voltage $V_{IN}$ of the output stage. An N-channel transistor 68 has the source/drain path thereof connected between the node 66 and $V_{SSA}$ and the gate thereof connected to a bias voltage. Both transistor 60 and transistor 68 comprise separate constant current sources.

A P-channel transistor 70 has the source/drain path thereof connected between the voltage $V_{DDA}$ and a node 72, P-channel transistor 70 providing a current source. An N-channel transistor 74 has the source/drain path thereof connected between node 72 and the voltage $V_{SSA}$ with the gate thereof connected to the gate of an N-channel transistor 76. Transistor 76 has the source thereof connected to $V_{SSA}$ and both the gate and the drain thereof connected to a node 78. The transistor 74 is therefore mirrored from transistor 76.

A P-channel transistor 80 has the drain thereof connected to the node 78 and the source thereof connected to the emitter of a bi-polar transistor 82. The gate thereof is connected to a signal AB Bias. The base of the bi-polar transistor 82 is connected to the gate of transistor 70 and also to node 62. Transistors 80 and 82 provide a feedback network wherein the transistor 82 provides a low impedance control of the source of transistor 80. Node 66 is connected to node 72 through a switch 84. In a similar manner, node 66 is connected to a node 86 through a switch 88, and node 86 is also connected to node 72 through a switch 90. Node 86 is connected to one side of the load resistor 92 and also to ground through a switch 94.

In operation, the control input to switches 84 and 94 is a SQUELCH signal and the control input to switches 88 and 90 is a SQUELCH-Bar input, which is the inverse of the SQUELCH signal. Therefore, in one mode, the SQUELCH mode, the switches 84 and 94 are closed, shorting node 66 to node 72 and also shorting node 86 to ground. In the normal operating mode, switches 84 and 94 are open and switches 88 and 90 are closed, connecting node 66 to node 72 and also to node 86.

Bi-polar transistor 82 is utilized in lieu of an N-channel transistor due to the larger transconductance with no back-gate problems presented thereby. Bias current in transistors 70 and 74 is controlled by the AB Bias signal, which provides the gate bias for transistor 80. Signal operation is based on feedback control of the gate potential of transistor 70 to the voltage on node 62. As the gate potential of transistor 70 decreases, current through transistor 70 increases to supply current to the output node 66. At the same time, the $V_{GS}$ of transistor 80 decreases, which decreases the current in the mirrored transistors 74 and 76. As the gate potential of transistor 70 at node 62 increases, the current in transistor 70 decreases while the current through transistor 80 and the mirrored transistors 74 and 76 increases to sink load current through the switch 84. Note that the operation is class AB since transistors 70 and 74 can source/sink more load current $I_L$ than their operating bias current. Generation of the bias signal AB Bias is described in U.S. patent application Ser. No. 641,182, filed Jan. 15, 1991 and entitled "Low Distortion Amplifier Output Stage for DAC" and assigned to the present assignee, which patent application is incorporated herein by reference.

Figure 6:
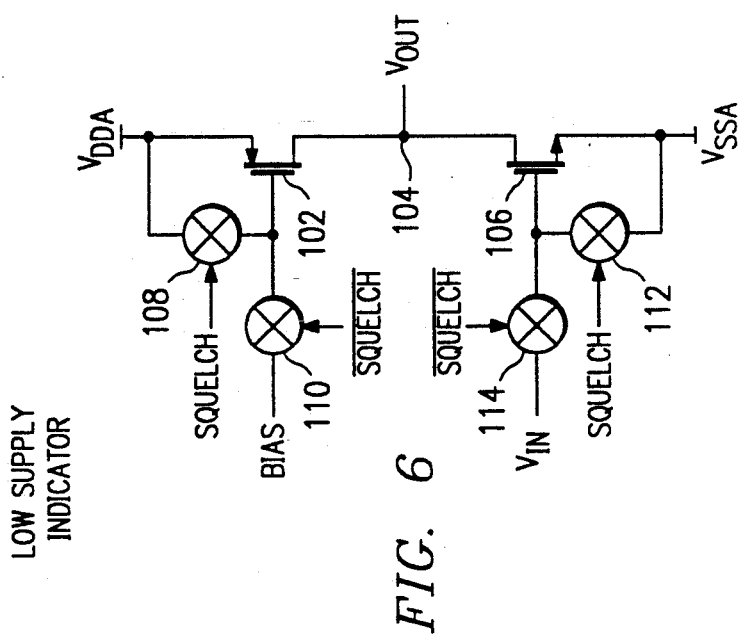
FIG. 6 illustrates a schematic diagram of the output stage with the power down feature.

Referring now to FIG. 6, there is illustrated a schematic diagram for an alternate embodiment of the present invention wherein the output stage 26 is powered down. The output stage is a conventional configuration utilizing a current source p-channel transistor 102 which has the source/drain path thereof connected between the voltage $V_{DDA}$ and a voltage output terminal 104. An n-channel transistor 106 has the source/drain path thereof connected between the output node 104 and the voltage $V_{SSA}$. The current in transistor 102 is controlled by switches 108, 110 and the bias voltage. Switch 108 is connected between the gate of transistor 102 and the voltage $V_{DDA}$, and controlled by the SQUELCH signal A switch 110 is connected between the gate of transistor 102 and the signal BIAS and is controlled by the SQUELCH-Bar signal. In a similar manner, transistor 106 is controlled by two switches 112 and 114. Switch 112 is connected between the gate of transistor 106 and $V_{SSA}$ and controlled by the SQUELCH signal, and the switch 114 is connected to the gate of transistor 106 and the input signal to the stage and switch 114 is controlled by the SQUELCH-Bar signal. In operation, switches 108 and 112 are open during normal operation and the switches 110 and 114 are closed. During power down operation, switches 110 and 114 are open and switches 108 and 112 are closed.

In summary, there has been provided a power down control circuit for a DAC which utilizes circuitry to detect a low power supply condition and then isolates the internal DAC output from the analog output terminal of the DAC during the low power operation. Further, circuitry is provided to force the output terminal of the DAC to a predetermined voltage level during the low power operation. The circuitry in the preferred embodiment disconnects the output of the DAC to the analog output terminal through a switch opening.

Although the preferred embodiment has been described in detail, it should be understood that various changes, substitutions and alterations can be made therein without departing from the spirit and scope of the invention as defined by the appended claims.

What is claimed is:

1. An integrated digital-to-analog converter for operating in a low power condition, comprising:
    a power supply terminal for receiving a power supply voltage;
    a digital input terminal for receiving a digital input signal;
    an analog output terminal for outputting an analog output signal;
    a digital-to-analog converter circuit operating from the received power supply voltage input to said power supply terminal and for converting said digital input signal to an analog output signal;
    interface circuitry integral with said digital-to-analog converter circuit for connecting the analog output signal of said digital-to-analog converter circuit to said analog output terminal during a normal mode of operation at a normal power supply voltage level;
    a low power supply detection circuit integral with said digital-to-analog converter circuit for detecting when the received power supply voltage at the power supply terminal falls below a predetermined threshold which constitutes a lower than normal power supply voltage, said power supply detection circuit operable to generate a control signal in response thereto; and
    control circuitry for controlling said interface circuitry to operate in a low power mode of operation and isolate the signal output by said digital-to-analog converter circuit from said analog output terminal in response to generation of said control signal by said low power supply detect circuit and connect said analog output terminal to an internal finite reference voltage during at least a portion of the time said analog output terminal is isolated from the signal output by said digital-to-analog converter, said control circuitry operable to return said interface circuitry to said normal operation mode when said control signal is not generated.

2. The digital-to-analog converter of claim 1, wherein said control interface circuitry comprises a switch being connected between the output of said digital-to-analog converter circuit and said analog output terminal, said control circuitry operable to controls aid switch to be in a closed configuration when said control signal is not generated and in an open configuration when said control signal is generated.

3. The digital-to-analog converter of claim 2, wherein said interface circuitry comprises a shunt switch for being connected between said analog output terminal and said finite reference voltage, said shunt switch controlled by said control signal to operate in a closed configuration in the presence of said control signal and in an open configuration in the absence of said control signal.

4. The digital-to-analog converter of claim 1, wherein said interface circuitry comprises a shunt switch connected between said analog output terminal and said finite reference voltage, said control circuitry operable to operate said shunt switch in a closed configuration in the presence of said control signal and in an open configuration in the absence of said control signal.

5. The digital-to-analog converter of claim 1, wherein said digital-to-analog converter circuit includes an output stage and said interface circuitry includes means for varying the output impedance of said output stage, wherein said control circuitry is operable to increase the output impedance of said means for varying to a high impedance level in response to generation of said control signal.

6. The digital-to-analog converter of claim 5, wherein said interface circuitry comprises a shunt switch connected between said analog output terminal and said internal finite reference voltage, said shunt switch controlled by said control circuitry to operate in a closed configuration when said control signal is generated and in an open configuration in the absence of said control signal.

7. The digital-to-analog converter of claim 1, wherein said digital-to-analog converter circuit comprises:
 a delta-sigma digital modulator for converting an n-bit digital input signal received on said digital input terminal to an m-bit digital output signal, m being less than n;
 an m-bit digital-to-analog converter for converting said m-bit digital signal to an analog signal; and
 a low-pass filter for filtering said analog signal.

8. The digital-to-analog converter of claim 1, wherein said digital-to-analog converter circuit includes an output stage and said interface circuitry includes means for varying the output impedance of said output stage, wherein said control circuitry is operable to increase the output impedance of said means for varying to a high impedance in response to generation of said control signal.

9. An integrated digital-to-analog converter for operating in a low power condition, comprising:
 a power supply terminal for receiving a power supply voltage;
 a digital input terminal for receiving a digital input signal;
 an analog output terminal for outputting an analog output signal;
 a digital-to-analog converter circuit operating from the received power supply voltage input to said power supply terminal and for converting said digital input signal to an analog output signal;
 interface circuitry integral with said digital-to-analog converter for connecting the analog output signal of said digital-to-analog converter circuit to said analog output terminal during a normal mode of operation at a normal power supply voltage level;
 a low power supply detection circuit integral with said digital-to-analog converter for detecting when the received power supply voltage at the power supply terminal falls below a predetermined threshold which constitutes a lower than normal power supply voltage, said power supply detection circuit operable to generate a control signal in response thereto; and
 control circuitry for controlling said interface circuitry to operate in a low power mode of operation and force the signal output by said digital-to-analog converter circuit from said analog output terminal to predetermined and finite signal level independent of said digital input signal in response to generation of said control signal by said low power supply detect circuit, said control circuitry operable to return to said normal operation mode when said control signal is not generated as a result of the received power supply voltage at the power supply terminal rising above said predetermined threshold.

10. The digital-to-analog converter of claim 9, wherein said interface circuitry comprises a shunt switch for being connected between said analog output terminal and said predetermined reference signal level, said shunt switch controlled by said control signal to operate in a closed configuration in the presence of said control signal and in an open configuration in the absence of said control signal, said control circuitry operable to isolate the output of said digital-to-analog converter from said analog output terminal.

11. The digital-to-analog converter of claim 10, wherein said predetermined reference signal is an internal reference signal.

12. The digital-to-analog converter of claim 10, wherein said internal reference signal is ground.

13. A method for operating a digital-to-analog converter in a low power condition, comprising:
 receiving an external power supply voltage on the power supply terminal;
 receiving a digital input signal on a digital input;
 converting the digital input signal to an analog output signal with a digital-to-analog converter that operates from said received power supply voltage;
 interfacing the analog output voltage to an analog output terminal during a normal mode of operation at a normal power supply voltage level;
 detecting a low power supply condition when the power supply voltage falls below a predetermined threshold which constitutes a lower than normal power supply voltage and generating a control signal in response thereto;
 operating in a low power mode of operation and isolating the analog output terminal from the output of the digital-to-analog converter in response to generation of the control signal; and
 connecting the analog output terminal to an internal finite reference voltage during the low power mode of operation.

14. The method of claim 13, wherein the step of isolating comprises the step of disconnecting the analog output of the digital-to-analog converter from the analog output terminal.

15. The method of claim 13, wherein the step of connecting comprises providing a switch for operating in a closed configuration in response to generation of the control signal, the switch connecting the analog output terminal to said internal finite reference voltage.

16. The method of claim 13, wherein the digital-to-analog circuit comprises an output stage, and the step of isolating comprises powering down the output stage to increase the output impedance thereof.

17. The method of claim 13, wherein the step of converting the digital signal to an analog output signal comprises:
 receiving an n-bit digital input signal;
 converting the n-bit digital input signal to an m-bit digital signal with a digital delta-sigma modulator;
 converting the m-bit digital signal to an analog signal with an m-bit digital-to-analog converter; and
 filtering the output of the m-bit digital-to-analog converter to provide the analog output signal.

18. A method for operating a digital-to-analog converter in a low power condition, comprising:
   receiving an external power supply voltage on the power supply terminal;
   receiving a digital input signal on a digital input;
   converting the digital input signal to an analog output signal with a digital-to-analog converter that operates from said received power supply voltage;
   interfacing the analog output voltage to an analog output terminal during a normal mode of operation at a normal power supply voltage level;
   detecting a low power supply operating condition in the digital-to-analog converter when the power supply voltage falls below a predetermined threshold which constitutes a lower than normal power supply and generating a control signal in response thereto; and
   forcing the signal on the analog output terminal to a finite predetermined internal voltage independent of the digital input signal in response to generation of the control signal.

19. The method of claim 18, wherein the step of forcing comprises connecting the analog output terminal to said internal voltage in response to generation of the control signal and isolating the digital-to-analog converter from the analog output terminal.

20. The method of claim 18, wherein the step of forcing comprises providing a switch for operating in a closed configuration in response to generation of the control signal, the switch connecting the analog output terminal to said internal voltage.

* * * * *